US012805098B2

(12) United States Patent
Kall et al.

(10) Patent No.: US 12,805,098 B2
(45) Date of Patent: Nov. 17, 2026

(54) DISPLAY DEVICE HAVING A FLEXIBLE DISPLAY FILM

(71) Applicant: LightnTec GmbH, Karlsruhe (DE)

(72) Inventors: Florian Kall, Karlsruhe (DE); Lutz Nehrhoff von Holderberg, Karlsruhe (DE); Stephan Wittekind, Engelskirchen (DE); Martin Brückel, Karlsruhe (DE)

(73) Assignee: LightnTec GmbH, Karlsruhe (DE)

( * ) Notice: Subject to any disclaimer, the term of this patent is extended or adjusted under 35 U.S.C. 154(b) by 0 days.

(21) Appl. No.: 19/316,725

(22) Filed: Sep. 2, 2025

(65) Prior Publication Data

US 2025/0393353 A1 Dec. 25, 2025

Related U.S. Application Data

(63) Continuation-in-part of application No. PCT/EP2024/056027, filed on Mar. 7, 2024.

(30) Foreign Application Priority Data

Mar. 7, 2023 (DE) ......................... 102023202023.8

(51) Int. Cl.

| | |
|---|---|
| ***H10H 29/24*** | (2026.01) |
| ***G06V 20/54*** | (2022.01) |
| ***G09G 3/32*** | (2016.01) |
| ***H10H 29/855*** | (2025.01) |

(52) U.S. Cl.

CPC ............. *H10H 29/24* (2025.01); *G06V 20/54* (2022.01); *G09G 3/32* (2013.01); *H10H 29/855* (2025.01); *G06V 2201/08* (2022.01)

(58) Field of Classification Search

CPC ...... H10H 29/24; H10H 29/855; G06V 20/54; G06V 2201/08; G09G 3/32; G06F 1/1652

USPC .......................................................... 345/204

See application file for complete search history.

(56) References Cited

U.S. PATENT DOCUMENTS

| | | | | |
|---|---|---|---|---|
| 6,377,402 | B1 * | 4/2002 | Ma | G02B 27/0172 359/633 |
| 6,578,301 | B1 * | 6/2003 | Ericson | G09F 15/0018 40/606.18 |
| 11,238,494 | B1 * | 2/2022 | Burcham | G06Q 30/0254 |
| 2015/0084858 | A1 * | 3/2015 | Murakami | G06V 40/174 345/156 |

(Continued)

FOREIGN PATENT DOCUMENTS

| | | |
|---|---|---|
| CN | 108735109 A | 11/2018 |
| DE | 102 37 315 A1 | 2/2004 |

(Continued)

OTHER PUBLICATIONS

LIGHTNTEC "ledTecflex | wallpaper | p. 32 | 2500lm | ip20", Product Datasheet p. 32, v2.0, V1.0, Dec 2022, 6 Pages.

*Primary Examiner* — Nathan P Brittingham

(74) *Attorney, Agent, or Firm* — Orbit IP, LLP; Marc G. Martino

(57) ABSTRACT

A display device has a display film which has a size of more than 5 $m^2$ and a thickness of preferably less than 5 mm. The display film can include a plurality of LED module each having at least one LED. The display device includes, in particular, a holder for holding a placard of the same size, the holder now holding the display film.

19 Claims, 1 Drawing Sheet

(56) References Cited

U.S. PATENT DOCUMENTS

| | | | | |
|---|---|---|---|---|
| 2016/0202729 | A1* | 7/2016 | Lee | G06F 1/1652 361/749 |
| 2020/0223198 | A1* | 7/2020 | Kurihara | B32B 27/08 |
| 2021/0111157 | A1* | 4/2021 | Rossini | H10W 90/00 |
| 2021/0217341 | A1* | 7/2021 | Huang | G11C 19/28 |
| 2021/0304641 | A1 | 9/2021 | Yang | |
| 2022/0252932 | A1* | 8/2022 | Kim | G02F 1/133614 |
| 2023/0238362 | A1* | 7/2023 | Liang | H10W 90/00 257/79 |
| 2024/0113266 | A1* | 4/2024 | Tamaki | H10H 20/855 |
| 2024/0292654 | A1* | 8/2024 | Huang | H10K 59/10 |
| 2025/0329168 | A1* | 10/2025 | Noh | G06V 20/54 |

FOREIGN PATENT DOCUMENTS

| | | | | | |
|---|---|---|---|---|---|
| DE | 10 2004 063 366 | B3 | | 6/2006 | |
| DE | 10 2006 004 825 | B3 | | 5/2007 | |
| DE | 20 2010 016 791 | U1 | | 2/2011 | |
| JP | 2013242852 | A | * | 12/2013 | G06Q 30/0272 |
| KR | 101789142 | B1 | * | 10/2017 | G09F 9/301 |
| KR | 102467411 | B1 | | 11/2022 | |
| WO | 2005/109382 | A2 | | 11/2005 | |
| WO | 2017/010940 | A1 | | 1/2017 | |

* cited by examiner

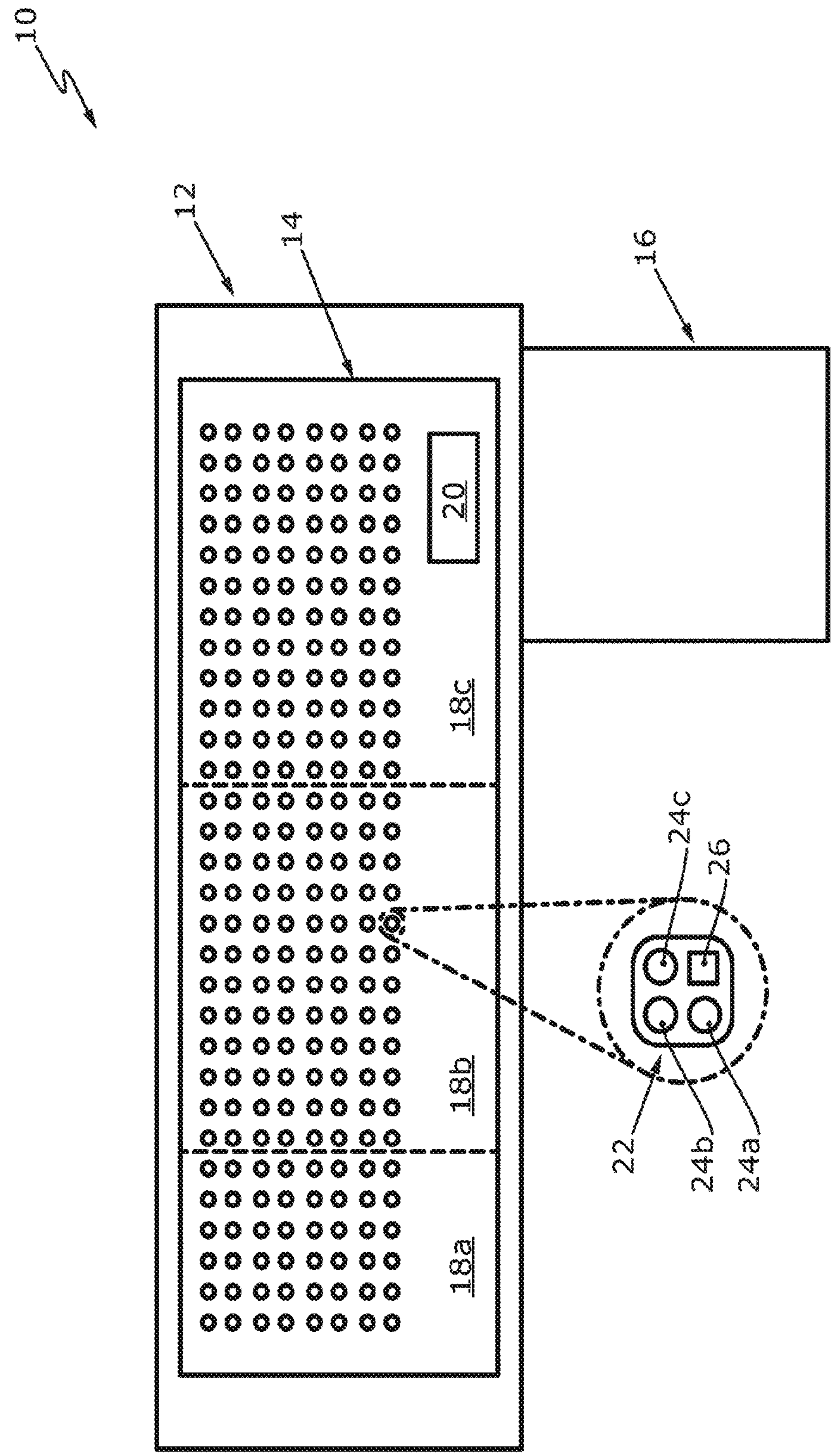
10
12
14
16
20
18c
18b
18a
22
24a
24b
24c
26

DISPLAY DEVICE HAVING A FLEXIBLE DISPLAY FILM

CROSS-REFERENCE TO RELATED APPLICATIONS

This continuation application claims priority to PCT/EP2024/056027 filed on Mar. 7, 2024, which has published as WO 2024/184462 A1; and also the German application number DE 10 2023 202 023.8 filed on Mar. 7, 2023, the entire contents of which are fully incorporated herein with these references.

DESCRIPTION

Field of the Invention

It is known to use display devices for placards and/or posters.

Background of the Invention

The disadvantage of the known display devices is that the placards or posters must be replaced manually by replacing the printed placards or posters. Replacing the existing display devices with displays usually requires the time-consuming obtaining of a building and/or modification permit.

SUMMARY OF THE INVENTION

Object of the Invention

It is therefore an object of the invention to provide a display device which can be flexibly controlled in a simpler manner.

DESCRIPTION OF THE INVENTION

This object is achieved by a display device according to the claims, the use of a display device according to the claims, as well as a method according to the claims. The dependent claims reflect preferred developments.

The object of the invention is therefore achieved by a display device having a flexible display film and a holder for the display film, wherein the display film has a plurality of individually controllable pixels for the flexible display of different images and an area of more than 5 $m^2$.

The display device according to the invention enables a “retrofitting” or digitization of existing placard and poster displays by simply replacing a placard or poster of such an already installed placard or poster display with an electric digital display film. Typically, no building and/or modification permits need to be obtained for such a “retrofitting”. The display device according to the invention avoids the replacement of the existing approved support structure by using a wafer-thin film. By digitizing them using a “film display”, the display device according to the invention avoids the manual exchange of posters and placards. Rather, the content reproduced on the display film can be changed at the touch of a button.

The pixels of the display film can be reflective, i.e., not self-radiating. The display film can be based on an e-wetting technology; for example, the display film can be in the form of an e-paper.

The display device preferably has an area of more than 7 $m^2$, particularly preferably more than 8 $m^2$.

In a particularly preferred embodiment of the invention, the display film has a size of 356 cm×252 cm.

The maximum thickness, in particular, the thickness of the majority of the area, of the display film is preferably less than 7 mm, in particular, less than 5 mm, more preferably less than 3 mm, particularly preferably less than 1 mm.

The display film can have a plurality of film segments. The film segments can have the same or different areas.

The pixels of the display film can be designed in the form of LED (light-emitting diode) modules, each having at least one LED.

The LED modules can be arranged in a matrix. In the simplest case, the LED modules each consist of one LED. The LED modules, on the other hand, can also have control electronics. The LED modules can have a plurality of LEDs, especially of different colors. Preferably, the LED modules each have at least one red, green and blue LED.

The LEDs can be designed in the form of OLEDs (organic LEDs).

In order to achieve sufficient resolution with the simplest possible design of the display film, the pixels can have a distance of between 0.3 mm and 16 mm to the next closest pixel.

In order to enable particularly energy-efficient operation of the pixels, the display film can have display film micro-optics on a plurality of pixels.

The micro-optics can be designed to reduce the beam angles of the LED modules to typical sight and viewing axes.

In a further embodiment of the invention, different pixels can be designed to operate with different supply voltages.

The power supply unit for providing the supply voltage can be spaced at least 50 cm from the display film, in particular, at least 1 m, particularly preferably more than 1.5 m. The spatial distance between the power supply and the display film enables the display film to be designed in a particularly light and space-saving manner, and therefore makes retrofitting particularly easy.

The power supply can be fastened to the floor to a stand. The display device can have a fuse box with the power supply.

One part of the display device can be designed to operate with a supply voltage of 3 volts to 6 volts; another part of the display device can be designed to operate having a supply voltage of 7 volts to 48 volts. This enables further optimization of energy efficiency.

The display film can be designed to be particularly compact if it has driver electronics integrated into the display film.

The display device can have a data cable and/or an antenna for receiving the images to be displayed. Alternatively or additionally thereto, the display device can have an interface for connection to a content management system (CMS).

The thickness of the driver electronics of the display device on or in the display film is preferably less than 6 mm, in particular, 4 mm, preferably 2 mm, perpendicular to the plane of extension of the display film.

The display film preferably has driver electronics which do not have a test image generator and/or an image content data memory. This enables image generation and image processing (Where is the pixel? Does it need to be corrected?) away from the display film. The display film cannot therefore generate images on its own. Particularly preferably, the driver electronics can only perform a digital-to-analog conversion.

In contrast to the driver electronics, control electronics of the display device are preferably not arranged on the display film or integrated into the display film but are arranged at a distance from the display film. The control electronics are preferably spaced more than 50 cm, in particular, more than 1 m, particularly preferably more than 1.5 m, from the display film.

The spatial distance between the control electronics and the display film enables the display film to be designed in a particularly light and space-saving manner, and therefore makes retrofitting particularly easy.

The display device can have a support sheet stretched over the display film.

Alternatively or additionally thereto, the display device can have a self-tensioning mounting frame to stabilize the display film.

The display film can have a puzzle structure for arranging film segments.

The display film can be fixed in the display device by a Velcro strip and/or a spring.

For permanent outdoor installation of the display device, the display device can be protected against the ingress of splash water from all sides and against the ingress of solid foreign bodies with a diameter of more than 1 mm.

Alternatively or additionally thereto, the display device can be protected against vandalism and theft.

In a further preferred embodiment of the display device, it can have a closable opening which is designed for the exchange of posters and/or placards, wherein the display film can be exchanged via the closable opening.

The display device can be designed to show videos whose individual images cannot be distinguished by the human eye. Alternatively, the display film can only be designed to show image changes at intervals of more than 1 second.

The display film can be designed to only show image changes at intervals of more than 2 seconds, preferably more than 10 seconds. This allows distraction of road users to be prevented.

Alternatively or additionally thereto, the display device can have a sensor that is configured to identify stationary road traffic, wherein control electronics of the display device are configured to initiate an image change only upon the detection of stationary road traffic. This can safely prevent distractions for road users. For example, an image change can only be initiated when all road users are waiting at a red traffic light. The control electronics can be AI-based.

The display film can have a light-absorbing base film. The base film can have an extremely matt black light-absorbing and contrast-enhancing top layer, in particular, in the form of a deep black flock and/or light-absorbing micro-optics to increase the contrast and energy efficiency of the display film.

The display device can be designed for wall mounting. Alternatively or additionally thereto, the display device can have a first stand for freestanding installation of the display device. The display device can have a second stand.

The display film preferably has a total weight of less than 100 kg and can therefore be installed without a crane. Particularly preferably, the display film has a maximum weight of less than 7 $kg/m^2$, especially 5 $kg/m^2$, more preferably 3 $kg/m^2$.

The display device preferably has only one driver electronics, one control electronics and/or one power supply.

The object according to the invention is further achieved by the use of a display device for presenting a paper poster and/or a paper placard for presenting a flexible display film, wherein the display film has a plurality of individually controllable pixels for displaying different images and has an area of more than 5 $m^2$.

The display device and the display film can be designed as described above and below.

The object according to the invention is further achieved by a method for operating a display device described herein, having the method steps of:

A) Image generation and/or image processing in control electronics that are arranged at a distance from the display film;
B) Transmission of the image information from the control electronics to driver electronics that are arranged on or in the display film;
C) Digital-to-analog conversion of the image information in the driver electronics;
D) Control of the pixels by the driver electronics.

In the method according to the invention, the image generation and basic image processing are shifted away from the display film so that the display film can be designed to be particularly space- and weight-saving, which significantly facilitates retrofitting.

Further advantages of the invention can be found in the description and the drawings. Likewise, according to the invention, the aforementioned features and those which are to be explained below can each be used individually or together in any desired combinations. The embodiments shown and described are not to be understood as an exhaustive list, but, rather, have an exemplary character for the description of the invention.

BRIEF DESCRIPTION OF THE DRAWINGS

FIG. 1 shows a side view of a display device according to the invention.

DETAILED DESCRIPTION OF EMBODIMENTS OF THE INVENTION

FIG. 1 shows a display device 10 having a holder 12 in which a display slide 14 is arranged. In the present case, the holder 12 is designed in the form of an, in particular, weatherproof housing. The holder 12 stands on a stand 16.

The display film 14 has a plurality of film segments 18*a, b, c*. The display film 14 has driver electronics 20 integrated into the display film 14.

The display film 14 has a plurality of LED modules, of which only one LED module 22 is provided with a reference sign in FIG. 1 for reasons of clarity. The LED modules 22 represent pixels of the display film 14.

From the enlarged view in FIG. 1, it can be seen that the LED modules 22 each have a plurality of LEDs 24*a, b, c* and control electronics 26.

The display film 14 shown in FIG. 1 was previously replaced by a classic placard. This made it possible for digitalization or retrofitting of the display device 10 to be easily achieved.

Taking a summary of the drawing, the invention relates to a display device 10 having a more than 5 $m^2$ large and preferably less than 5 mm thick display film 14. The display film 14 can have a plurality of LED modules 22, each having at least one LED 24*a-c*. The display device 10 has, in particular, a holder 12 for holding a placard of the same size, which now holds the display film 14.

LIST OF REFERENCE SIGNS

10 Display device
12 Holder

14 Display film
16 Stand
18*a-c* Film segments
20 Driver electronics
22 LED module
24*a-c* LEDs
26 Control electronics

What is claimed is:

1. A display device comprising:
a flexible display film;
wherein the display film has a plurality of individually controllable pixels configured for displaying different images; and
wherein the display film has an area of more than 5 $m^2$;
wherein the display device has a holder for the display film;
wherein a power supply unit of the display device configured for providing the supply voltage is spaced at least 50 cm from the display film;
wherein control electronics of the display device are arranged at a distance of at least 50 cm from the display film.

2. The display device according to claim 1, wherein pixels are designed in the form of LED modules each having at least one LED.

3. The display device according to claim 1, wherein the pixels have a distance of between 0.3 mm and 16 mm to the next closest pixel.

4. The display device according to claim 1, wherein the display film has a micro-optics of the display film on a plurality of pixels configured to enable energy-efficient operation of the pixels.

5. The display device according to claim 1, wherein different pixels are designed to operate with different supply voltages.

6. The display device according to claim 1, wherein the display film has driver electronics integrated into the display film.

7. The display device according to claim 1, wherein the display device has driver electronics whose thickness perpendicular to the extension of the display film does not exceed 6 mm.

8. The display device according to claim 1, wherein the display device has driver electronics which do not have a test image generator and/or an image content data memory.

9. The display device according to claim 1, wherein the display device has a support sheet which is stretched over the display film.

10. The display device according to claim 1, wherein the display device has a self-tensioning mounting frame for stabilizing the display film.

11. The display device according to claim 1, wherein the display device has a Velcro strip and/or a spring for fixing the display film.

12. The display device according to claim 1, wherein the display device is protected against the ingress of splash water from all sides and against the ingress of solid foreign bodies with a diameter of more than 1 mm.

13. The display device according to claim 1, wherein the display device has a closable opening which is designed for the exchange of posters and/or placards, wherein the display film is exchangeable via the closable opening.

14. The display device according to claim 1, wherein the display film is designed exclusively for showing image changes at a time interval of more than 1 second.

15. The display device according to claim 1, wherein the display device has a sensor which is designed to identify stationary road traffic, wherein control electronics of the display device are configured to initiate an image change only upon the detection of stationary road traffic.

16. The display device according to claim 1, wherein the display film has a light-absorbing base film.

17. The display device according to claim 1, wherein the display film has a total weight less than 100 kg and/or a maximum weight of 7 kg/m 2.

18. A method for displaying the different images on the display device according to claim 1, wherein the display device has control electronics and driver electronics, having the method steps of:
A) generating and/processing an image information in control electronics that are arranged at a distance from the display film;
B) transmitting the image information from the control electronics to driver electronics that are arranged on or in the display film;
C) converting the image information from digital-to-analog in the driver electronics; and
D) controlling of the pixels by the driver electronics.

19. A display device configured for presenting a paper poster and/or a paper placard for presenting a flexible display film, wherein the display film has a plurality of individually controllable pixels for displaying different images and has an area of more than 5 $m^2$;
wherein a power supply unit of the display device configured for providing the supply voltage is spaced at least 50 cm from the display film;
wherein control electronics of the display device are arranged at a distance of at least 50 cm from the display film.

* * * * *